(12) United States Patent
Heidari

(10) Patent No.: US 8,277,717 B2
(45) Date of Patent: Oct. 2, 2012

(54) NANO IMPRINTING METHOD AND APPARATUS

(75) Inventor: Babak Heidari, Furulund (SE)

(73) Assignee: Obducat AB, Malmo (SE)

( * ) Notice: Subject to any disclaimer, the term of this patent is extended or adjusted under 35 U.S.C. 154(b) by 421 days.

(21) Appl. No.: 12/489,822

(22) Filed: Jun. 23, 2009

(65) Prior Publication Data

US 2009/0321990 A1 Dec. 31, 2009

Related U.S. Application Data

(60) Provisional application No. 61/075,351, filed on Jun. 25, 2008.

(30) Foreign Application Priority Data

Jun. 25, 2008 (EP) ..................................... 08158976

(51) Int. Cl.
*B29C 59/02* (2006.01)
(52) U.S. Cl. .......................... 264/293; 425/112; 264/496
(58) Field of Classification Search .................. 264/293, 264/496; 425/385, 112
See application file for complete search history.

(56) References Cited

U.S. PATENT DOCUMENTS

| 2005/0116370 A1 | 6/2005 | Ogino et al. |
| 2005/0214398 A1 | 9/2005 | Meissl et al. |
| 2006/0279025 A1 | 12/2006 | Heidari et al. |
| 2007/0134362 A1* | 6/2007 | Heidari .......................... 425/385 |
| 2007/0141191 A1 | 6/2007 | Kruijt-Stegeman et al. |

FOREIGN PATENT DOCUMENTS

| DE | 103 43 323 A1 | 4/2005 |
| EP | 1 801 649 A2 | 6/2007 |
| JP | 2002 2304781 | 10/2002 |
| WO | WO 03/005124 A1 | 1/2003 |
| WO | 2005/026837 A2 | 3/2005 |
| WO | WO 2008/045520 A2 | 4/2008 |

OTHER PUBLICATIONS

Xia Y et al: "Soft Lithography" Annual Review of Materials Science, Annual Reviews Inc., Palo Alto, CA, US. vol. 28, Jan. 1, 1998, pp. 153-184, XP009023786 ISSN: 0084-6600.
European Search Report dated Dec. 4, 2008 for corresponding European Patent Application No. 08158976.4.

* cited by examiner

*Primary Examiner* — Joseph Del Sole
*Assistant Examiner* — Kimberly A Stewart
(74) *Attorney, Agent, or Firm* — Renner, Otto, Boisselle & Sklar, LLP

(57) ABSTRACT

The present invention relates to a nano imprint method and to a nano imprint apparatus comprising: a first imprint module, a second imprint module, a storage and a feeder module, wherein; the first imprint module is adapted to imprint a pattern into an intermediate polymer stamp from a template; a second imprint module is adapted to imprint a pattern into a substrate from the intermediate polymer stamp; robot feeder modules are adapted to move the template, intermediate polymer stamp and the substrate from and to storages.

19 Claims, 4 Drawing Sheets

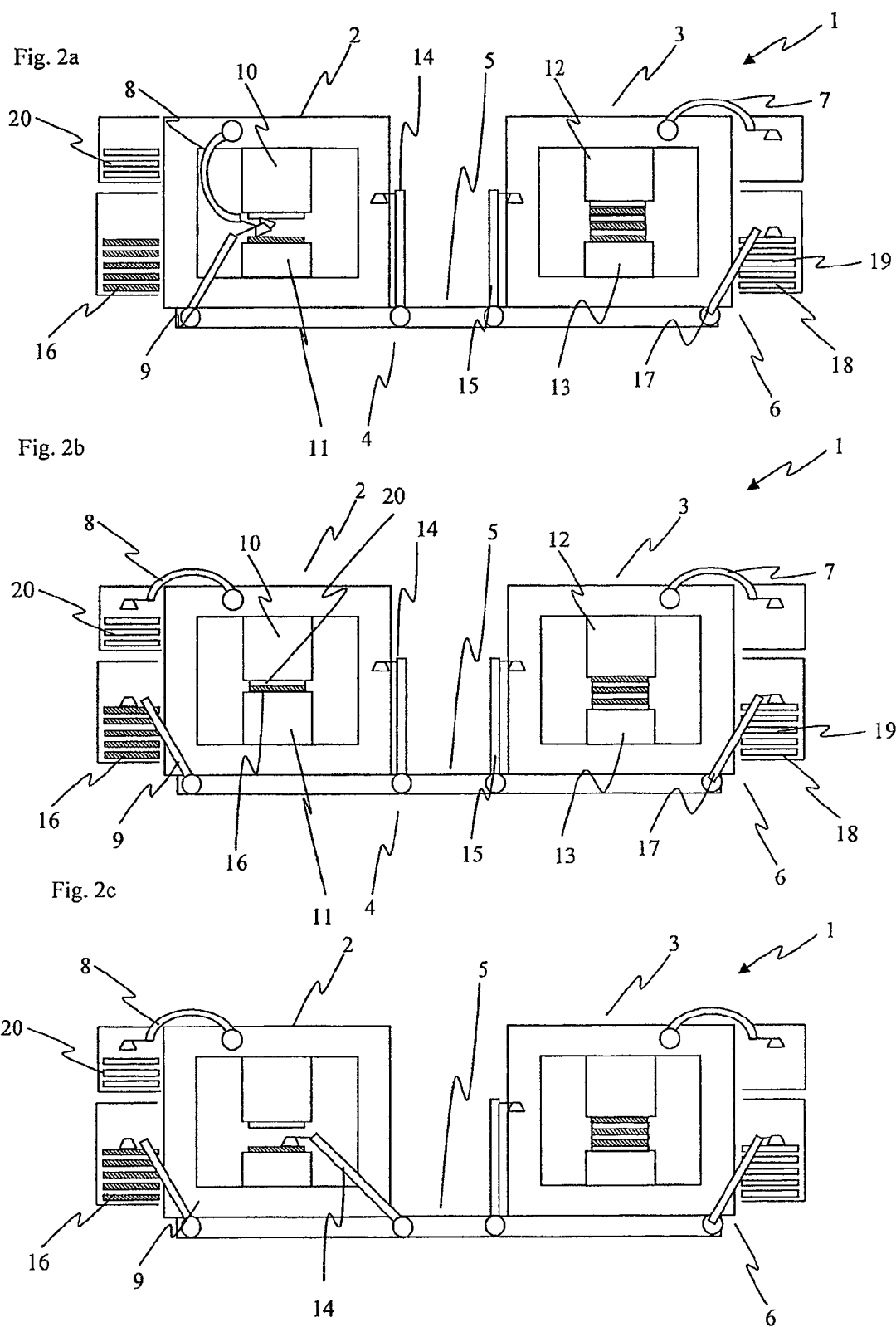

NANO IMPRINTING METHOD AND APPARATUS

FIELD OF INVENTION

The present invention relates to a nano imprint method and a nano imprint apparatus for a pattern transfer process for nano imprint lithography.

BACKGROUND

A technique for reproducing nano structures—i.e. structures in the order of 100 nm or smaller—is nano imprint lithography (NIL). In nano imprint lithography an inverted copy—often called a stamp or master stamp—of the surface pattern of a template is transferred into an object, comprising a substrate and, applied thereto, a film of a moldable layer often called resist, e.g. a polymer material. After heating the object to a suitable temperature above the glass transition temperature of the polymer film the stamp is pressed towards the film followed by cooling and release—often called demolding—of the stamp, after the desired pattern depth has been transferred into the film. Alternatively, the substrate is covered by a photo-resist material, i.e. a polymer, which is sensitive to radiation such that it is cross-linked upon exposure to ultraviolet (UV) radiation, or a pre-polymer, which is cured into a polymer upon exposure to radiation. This requires that either the substrate or the stamp is transparent to the applied radiation. In a subsequently performed process after the achieved imprint, the object—comprising the substrate and the patterned polymer film—can be post-processed e.g. by etching of the substrate within the imprinted regions to transfer the pattern to a target surface of the substrate.

The imprint process described above exhibits some difficulties, which have to be considered in order to achieve a perfect pattern transfer from the template into the moldable layer covering the substrate.

If the template and the substrate are not made of the same material, which they generally are not, they will typically have different thermal expansion coefficients. This means that during heating and cooling of the template and the substrate, the extent of expansion and contraction will be different. Even though the dimensional change is small, it may be devastating in an imprint process, since the features of the pattern to be transferred are in the order of micrometers or even nanometers. The result may therefore be reduced replication fidelity.

If an inflexible stamp or substrate material is used this can lead to the inclusion of air between stamp and moldable layer when the stamp is pressed towards the substrate, also downgrading the replication fidelity. Furthermore, inclusion of particles between stamp and moldable layer during an imprint process can lead to pronounced damages of either the stamp or the substrate especially when neither the stamp nor the substrate are composed by a flexible material. Physical damage to the stamp or the substrate or both can also be caused upon demolding of an inflexible stamp from inflexible substrate, and it is difficult to demold a substrate and a template including patterns with high aspect ratio after an imprint process. A once damaged stamp is usually not recyclable.

There is also a demand for increasing the speed and production rate, that is, to produce more replicas per time unit.

SUMMARY OF THE INVENTION

With the above description in mind, an aspect of some embodiments of the present invention is to provide method and a apparatus that at least partly solves the above identified problems.

An aspect of the present invention relates to a nano imprint apparatus comprising a first imprint module, a second imprint module, a storage and a feeder module, wherein; the first imprint module is adapted to imprint a pattern into a intermediate polymer stamp from a template at a first speed; the feeder module is adapted to move the intermediate polymer stamp from the first imprint module to the storage and from the storage to the second imprint module; the second imprint module is adapted to imprint a pattern into a substrate from the intermediate polymer stamp at a second speed; and the first speed is different from the second speed.

An advantage of this apparatus is that the intermediate polymer stamp and the substrate could be imprinted without dependency of each other.

A further advantage is that the first and the second imprint module can be different imprinters.

The first speed may be faster than the second speed.

The second speed may be faster than the first speed.

The second imprint module may be adapted to simultaneously imprint a pattern into a plurality of substrates from a plurality of intermediate polymer stamps.

An advantage of this is that the apparatus is able to produce imprint substrates at a rate that is independent of the speed of the slowest imprint module but only dependent on the speed of the fastest imprint module. Thus more substrates could be produced in less time.

The first imprint module may be an injection molding module that is adapted to imprint the pattern into intermediate polymer stamps by injection molding.

The first imprint module can be a cured film imprint module that is adapted to imprint the pattern into the intermediate polymer stamps by pressing the template against the intermediate polymer stamp.

The second imprint module may be a cured film imprint module that is adapted to imprint the pattern into the substrate by pressing the intermediate polymer stamp against the substrate.

The feeder module may comprise a first and a second feeder module, wherein the first module is adapted to move the intermediate polymer stamp from the first imprint module to the storage and the second feeder is adapted to move the intermediate polymer stamp from the storage to the second imprint module.

The nano imprint apparatus may further comprise an aligning module for aligning and joining substrates and intermediate polymer stamps for forming combined units in the second imprint module.

The nano imprint apparatus may further comprise a demolding unit, for removing the imprinted substrate from the intermediate polymer stamp The nano imprint apparatus may further comprise a second feeding module adapted to feed the imprinted substrates and intermediate polymer stamps from the second imprint module to the demolding unit.

The first imprint module may comprise a first plurality of first imprinters.

The second imprint module may comprise a second plurality of second imprinters.

The first plurality of first imprinters may be less than the second plurality of second imprinters.

The second imprint module may comprise an aligner; the aligner may comprise means for aligning a central cylindrical protrusion of an intermediate polymer stamp with a central cylindrical hole of a substrate.

The demolding unit may comprise a tank for immersing the combined units for removing the polymer stamp from the imprinted substrate by dissolving the polymer stamp in a solvent capable of solving the intermediate polymer stamp and unable of solving the substrate.

Another aspect of the present invention relates to a nano imprint method comprising the following steps:
- arrange a template and a intermediate polymer stamp in a first imprint module;
- imprint a pattern into the intermediate polymer stamp from the template at a first speed;
- move the intermediate polymer stamp from the first imprint module to a storage;
- move the intermediate polymer stamp from the storage to a second imprint module;
- arrange the intermediate polymer stamp to a substrate;
- imprint a pattern into the substrate from the intermediate polymer stamp at a second speed that is different from the first speed.

The first speed may be faster than the second speed.

The second speed may be faster than the first speed.

The pattern may be imprinted into a plurality of substrates simultaneously from a plurality of intermediate polymer stamps in the second imprint module.

The imprint of the pattern onto the intermediate polymer stamp from the template may be made by injection molding.

The imprint of the pattern onto the intermediate polymer stamp from the template may be made by pressing the template against the intermediate polymer stamp and thereafter curing the intermediate stamp.

The imprint of the pattern onto the substrate from the intermediate polymer stamp may be made by pressing the template against the intermediate polymer stamp and thereafter curing the intermediate stamp.

The step of moving the intermediate polymer stamp from the first imprint module to the storage and moving the intermediate polymer stamp from the storage to the second imprint module may be made by a feeder.

The nano imprint method may further comprise the step of aligning and joining substrates and intermediate polymer stamps for forming combined units.

The nano imprint method may further comprise the step of demolding, for removing the imprinted substrate from the intermediate polymer stamp.

The nano imprint method may further comprise the step of aligning a central cylindrical protrusion of an intermediate polymer stamp with a central cylindrical hole of a substrate.

The demolding may comprise the step of immersing the combined units in a tank comprising a solvent capable of solving the intermediate polymer stamp and unable of solving the substrate for removing the polymer stamp from the imprinted substrate.

A nano imprint apparatus comprising: a pressing module, a first and a second imprint module, a storage and a feeder module, wherein the first imprint module is adapted to imprint a pattern into an intermediate polymer stamp from a template, where the second imprint module is adapted to imprint a pattern into a substrate from the intermediate polymer stamp, wherein the feeder module is adapted to feed a substrate from the storage to the second imprint module and remove the substrate to the storage after imprint and wherein the intermediate polymer stamp is fixed An advantage of this apparatus is that the intermediate polymer stamp is fixed, which does not need alignment for each substrate imprint.

The second imprint surface module may be adapted to imprint a pattern onto a plurality of substrates from an intermediate polymer stamp.

The first imprint module is adapted to transfer the pattern from the template onto either the intermediate polymer foil film roller or individual intermediate polymer film by pressing the template against the intermediate polymer foil film roller, which produces a stamp.

The second imprint module is adapted to transfer the pattern from either the intermediate polymer film roller stamps or individual intermediate polymer stamp onto the substrate by pressing either the intermediate polymer film roller stamp or individual intermediate polymer stamp against the substrate.

The robot feeder module is adapted to exchange the substrate from and to the storage.

The nano imprint apparatus may further comprise a demolding unit, for removing the intermediate polymer stamp from the imprinted substrate.

Another aspect of the present invention is related to a nano imprint method comprising the following steps:
- arrange a template and an intermediate polymer stamp in a first imprint module;
- imprint a pattern into the intermediate polymer stamp from the template
- move a substrate from a storage to a second imprint surface module;
- move the template from the first imprint module;
- arrange the substrate to the intermediate polymer stamp by sliding the substrate holder horizontally in few micrometer range;
- imprint the pattern onto the substrate from the intermediate polymer stamp, while holding the intermediate polymer stamp fixed.

The pattern may be imprinted into a plurality of substrates from an intermediate polymer stamp; The pattern may be imprinted onto a plurality of substrates from a plurality of intermediate polymer stamps.

Pressing the template against the intermediate polymer stamp may make the imprint of the pattern onto the intermediate polymer stamp from the template.

BRIEF DESCRIPTION OF THE DRAWINGS

Further objects, features and advantages of the present invention will appear from the following detailed description of the invention, wherein embodiments of the invention will be described in more detail with reference to the accompanying drawings, in which:

FIGS. 2a-2e shows a schematic view of the nano imprint apparatus.

DETAILED DESCRIPTION

Figure 1A:
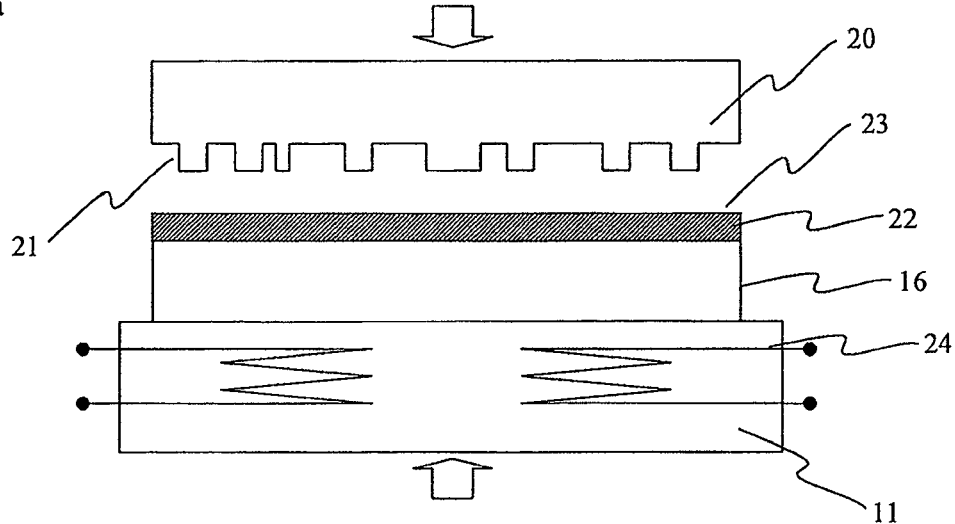
FIGS. 1a-1c shows a schematic view of the steps of imprinting an intermediate polymer stamp.

Embodiments of the present invention will hereinafter be described in more detail with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference signs refer to like elements throughout.

FIG. 2a shows a schematic view of a nano imprint apparatus 1 comprising a first imprint module 2, a second imprint module 3, a feeder module 4, a storage 5, a aligning module 6, a second feeding module 7, a demolding unit (not shown) a third feeding module 8 and a fourth feeding module 9.

The first imprint 2 module disclosed in FIG. 2 is a cured film imprinter 2. The cured film imprinter comprises a template holder 10, an intermediate polymer stamp holder 11, a heater (not disclosed), and curing element (not disclosed).

In another embodiment the first imprint module could be an injection molding imprinter. An injection molding imprinter comprises a template holder, a mold and a injection module. A cured film imprinter and a injection molding imprinter as such has been disclosed in prior art and will thus not be described in detail herein.

The second imprint module disclosed in FIG. 2 is a cured film imprinter comprising a plurality of intermediate polymer stamp holders 12 and a plurality of substrate holders 13, a heater (not disclosed) and curing element (not disclosed).

In another embodiment the second imprint module could a cured film imprinter comprise a heater, curing element and a plurality of imprinters, each comprising a intermediate polymer stamp holder and a substrate holder.

The feeder module 4 comprises a first and a second feeder 14, 15. The first feeder 14 is adapted to mover an intermediate polymer stamp 16 from the first imprinter module 2 to the storage 5. The second feeder 15 is adapted to move one or a plurality of intermediate polymer stamps 16 from the storage 5 to the second imprint module 3.

The storage 5 comprises a plurality of spaces (not disclosed) for receiving intermediate polymer stamps 16. The storage 5 is arranged between the first and the second imprint modules 2, 3.

The aligning module 6 comprises a aligning feeder 17 and a substrate unit 18. The aligning feeder 17 is adapted move a substrate 19 and to align and join substrates 19 and intermediate polymer stamps 16 for forming combined units.

The second feeding module 7 is adapted to feed the imprinted substrates 19 and the intermediate polymer stamps 16 from the second imprint module 3 to the demolding unit (not disclosed).

The demolding unit comprises a tank comprising a solvent. The solvent is capable of solving the intermediate polymer stamp 16 and unable of solving the substrate A method for producing a substrate according to the present invention will now be described.

The third and the fourth feeder 8, 9 move and arrange a template 20 in the template holder 10 and an intermediate polymer stamp 16 in the intermediate stamp holder 11 of the first imprint module 2.

Figure 1B:
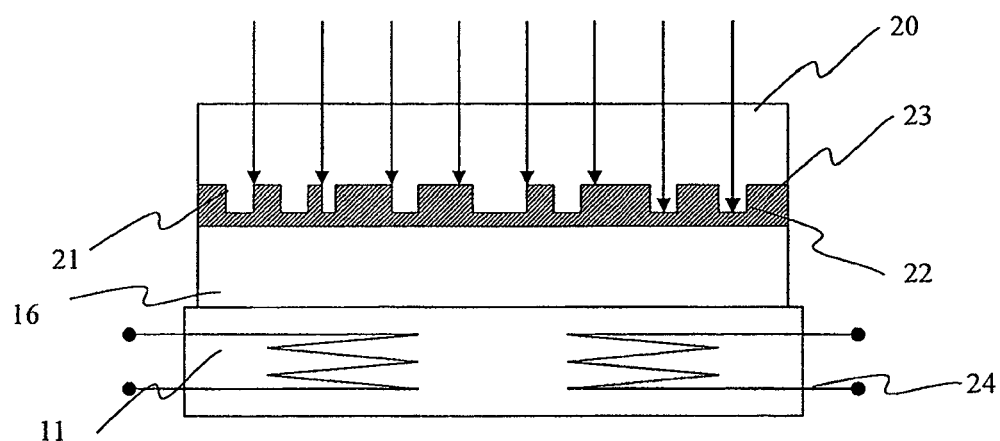
Figure 1C:
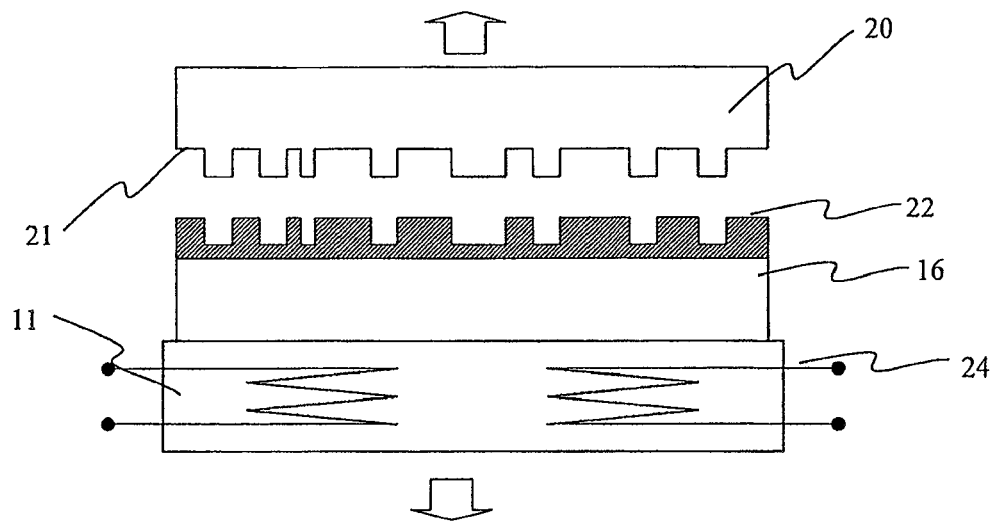

FIG. 1*a*-1*c* discloses a template 20, composed of e.g. silicon, nickel or other metal such as aluminum, quartz, or even a polymer material. Template 20 has a patterned surface 21, comprising ribs, grooves, protrusions or recesses, having heights and widths in the order of micrometers or nanometers. The template 20 is placed in the template holder 10 of the first imprint module 2 and an intermediate polymer stamp 16 is placed in the intermediate polymer stamp holder 11. The surface 21 of the template 20 is facing and contacting a surface 22 of the intermediate polymer stamp 16.

The intermediate polymer stamp 16 could be made of e.g. a thermoplastic polymer, a thermosetting polymer, and/or a polymer, which is cross-linkable e.g. with the help of exposure to radiation. More specific examples of suitable polymer foil materials include polycarbonate, COC and PMMA. The surface 21 of the template and the surface 22 of the intermediate polymer stamp 16 may exhibit anti-adhesion properties against to each other, due to their material compositions or characteristics of an anti-adhesion layer provided on surface 21 of the template 20 and/or the surface 22 of the intermediate polymer stamp, made of e.g. a thermoplastic polymer, a thermosetting polymer, and/or a polymer, which is cross-linkable e.g. with the help of exposure to radiation. More specific examples of suitable polymer foil materials include polycarbonate, COC and PMMA.

In the first imprint module 2 an inversion of the pattern of the surface 21 of the template is formed into a surface layer 23 at surface 22 of the intermediate polymer stamp, see FIGS. 1*a*-1*c*. After the surface 21 of the template 20 has been placed in contact with the surface 22 of intermediate polymer stamp, the intermediate polymer stamp is heated by a heater 24 to a temperature above the glass temperature Tg of the used polymer in the surface layer 23 of the intermediate polymer stamp 16. The intermediate polymer stamp 16 may be massive, i.e. having more or less the same composition throughout the entire polymer foil, or it may have a base composition of the actual intermediate polymer stamp with an applied surface layer 23 at surface 22 of another composition adapted for imprint. When the surface layer 23 has reached its glass transition temperature, pressure is applied to press template 20 and the intermediate polymer stamp 16 together such that the pattern of surface 21 is imprinted in the surface layer 23 at surface 22 of intermediate polymer stamp 16, see FIGS. 1*b* and 2*a*. Pressing may be achieved by means of a soft press technique using a fluid or gas pressure supplied by means of a membrane. Thereafter the intermediate polymer stamp 16 could be cured by radiation or any other suitable curing method. The intermediate polymer stamp 16 is produced at a first speed to obtain a good quality of the intermediate polymer stamp 16 and to be gentle to the template and not expose the template 20 to any unnecessary wear.

In another embodiment the intermediate polymer stamp is made by injection molding in the first imprint module.

Figure 2D:
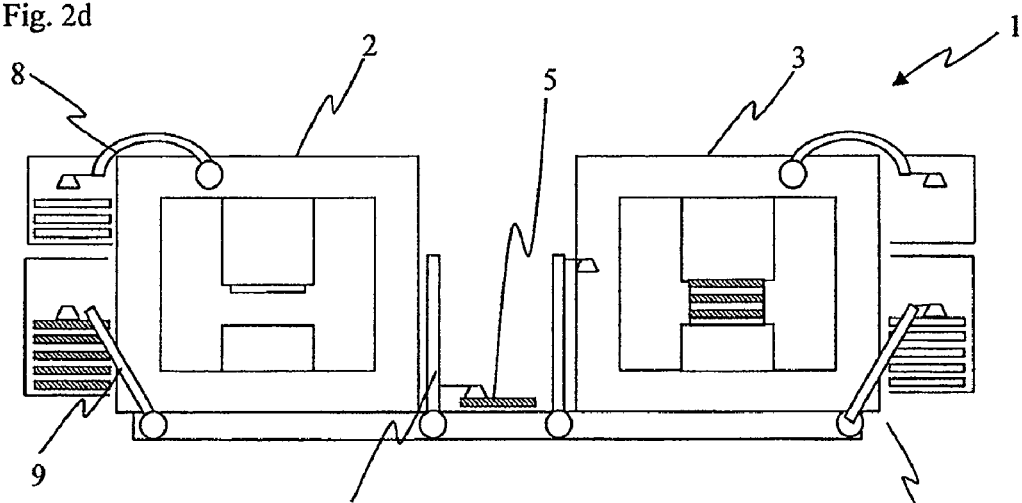

The first feeder 14 thereafter moves the intermediate polymer stamp 16 from the first imprint module 2 to the storage 5, see FIGS. 2*c* and 2*d*. After removal of the intermediate polymer stamp, the process in the first imprint module is repeated in accordance with the above, see FIGS. 2*a* and 2*b*. The template 20 does not have to be replaced every time and one and the same template 20 may be used to produce a number of intermediate polymer stamps 16.

Figure 2E:
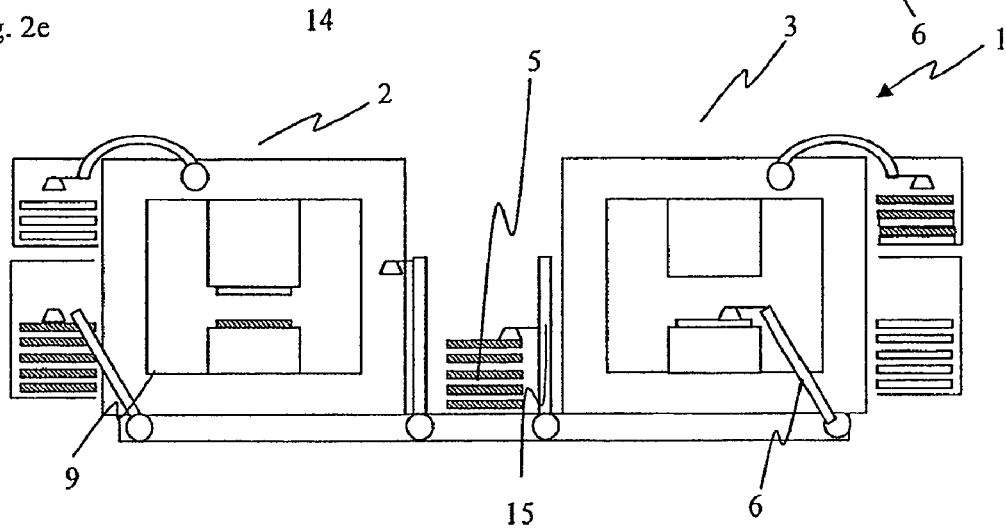

After having repeated the process above a plurality of times, a plurality of intermediate polymer stamps 16, is located in the storage 5, see FIG. 2*e*.

The second feeder 15 thereafter moves said plurality of intermediate polymer stamps 16 from the storage to the second imprint module 3. Simultaneously the aligner module 6 joins and aligns a substrate 19 on each intermediate polymer stamp 16.

In the second imprint module 3 an inversion of the pattern of the surface 23 of the intermediate stamps is formed into a surface layer of the substrate 19. After a plurality of surfaces 22 of the intermediate polymer stamps 16 has been placed in contact with the surface of a plurality of substrates 19, the substrates 19 are heated by a heater to a temperature above the glass temperature Tg of the used material in the substrates. When the surface of the substrate has reached its glass transition temperature, pressure is applied to press the intermediate polymer stamps 16 and the substrates 19 together such that the pattern of the surface 22 of the intermediate stamps is imprinted in the substrates, see FIG. 2*a*. Pressing may be achieved by means of a soft press technique using a fluid or gas pressure supplied by means of a membrane. The plurality of substrates 19 and intermediate polymer stamps 16 are hereafter removed by the second feeding module 7 from the second imprint module 3. The feeder modules are robot feeder modules, which feed the imprinting module from one end of the process and remove the finished substrate from the imprinting module after transferring the pattern to the substrate on the other end. The advantage of the robot feeders is to eliminate the man machine interface and adds adequacy to the manufacturing process.

The substrates 19 are produced in the second imprint step 3 at a second speed. The second speed is lower than the first speed. If n substrates 19 is imprinted simultaneously in the second imprint module 3, the first speed is preferably n-times faster than the second speed. By using this ratio between the first speed of the first imprint module 2 and the second speed of the second imprint module 3 the process of producing substrates 3 could be optimized. The imprint step that is faster does thus not have to be delayed due to the other slower imprint step.

To separate the intermediate polymer stamp 16 and the substrate 19 they could be demolded in the demolding unit (not disclosed). The intermediate polymer stamps 16 and the substrates 19 are immersed in a tank with a solvent. The solvent is capable of solving the intermediate polymer stamp 16 and unable of solving the substrate 19. The intermediate polymer stamps in thus solved by the solvent and the substrates 19 are ready.

Figure 3:
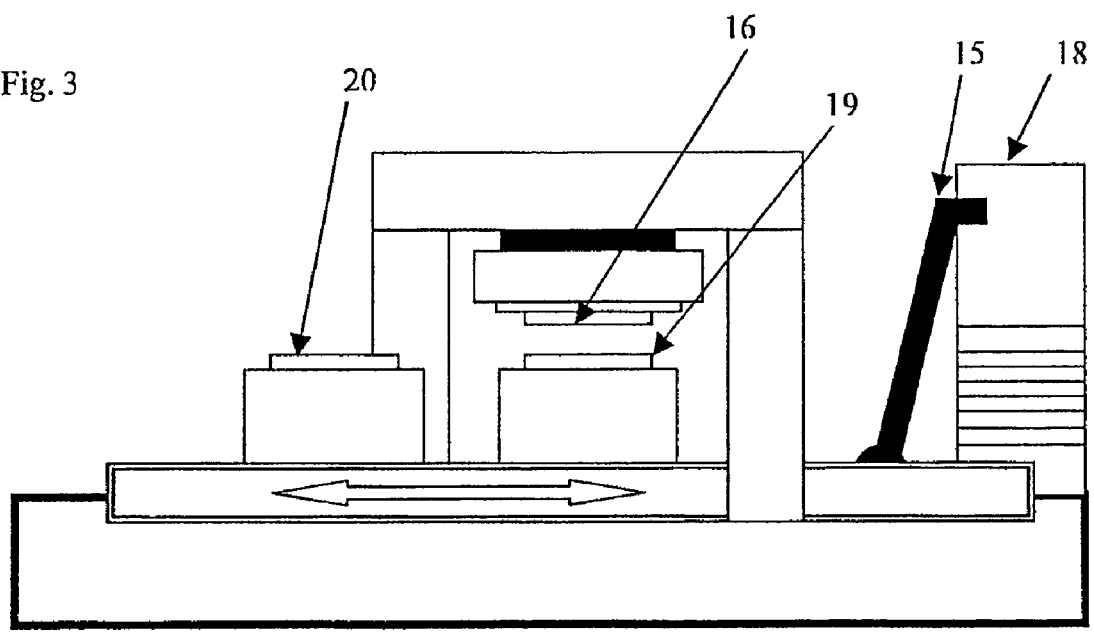
FIG. 3 shows the view of an alternative nano imprint apparatus.

FIG. 3 shows a schematic view of an alternative nano imprint apparatus comprising a first imprint surface module 20, a second imprint surface module 19, a feeder module 15, a substrate storage 18, a demolding unit (not shown).

The imprint surface modules 19, 20 disclosed in FIG. 3 is a foil film imprinter. The imprinter comprises a template holder 20, a substrate holder 19, a cooler and a heater.

The substrate storage 18 comprises a plurality of spaces (not disclosed) for receiving imprinted substrates and substrates that are ready to be imprinted. The storage 18 is arranged beside the second imprint surface module.

The apparatus in FIG. 3 has an advantage over the apparatus in FIG. 2 by having the intermediate polymer stamp rigid on the pressure module 16, and the template and the substrate are moving. First the template that is on the first imprint surface 20 moves and positioned under the pressure module 16 to transfer the structures onto the intermediate polymer film to produce the stamp, then the second imprint surface 19 that holds the substrate moves and positioned under the pressure module 16 to transfer the structures onto the substrate.

The advantages of a first imprinting an intermediate polymer stamp 16 and thereafter imprint a substrate 19 is that a durable and comparatively inflexible template may advantageously be used, made of a material such as a metal, quartz, silicon or other substantially inflexible material, for imprinting its pattern in a flexible polymer foil to create the polymer stamp, and the polymer stamp may then advantageously be used for imprint in a moldable layer on the target surface of the substrate. The relatively hard and inflexible template could used for imprint in the relatively softer and more flexible polymer foil to create an intermediate polymer stamp, where after the relatively flexible and soft polymer stamp is used for imprint in the moldable layer on the relatively harder and less flexible substrate, which may be of e.g. silicon. An imprint step between two substantially hard and inflexible materials, such as metal and silicon or quartz and silicon is thereby advantageously avoided, with the result that the template is less worn and fewer substrates are damaged. These different imprinting steps is made in different speeds and the apparatus and the method according to the invention thus combine the advantages of different imprinting steps and still achieve a high speed of production.

The template is a comparatively expensive element to produce and it is generally not possible to repair or recycle a once damaged template. The intermediate polymer stamp, however, is easily manufactured from a comparatively inexpensive material in accordance with the method according to the invention, and is preferably disposed after being used a couple of times, or even only once. The intermediate polymer stamp may be demolded, or released, from the substrate and then thrown away, or it may be dissolved when still attached to the target surface of the substrate in a bath with a suitable liquid solution selected to dissolve the polymer stamp but not the substrate or the solidified moldable layer on the target surface of the substrate.

In a further embodiment the intermediate polymer stamp could be reused in the second imprint step, i.e. one intermediate polymer stamp could be used to produce more than one substrate.

The template and/or the intermediate polymer stamp could be coated in the imprint module or before it is arranged in the imprint module using spay coating, spin coating, inkjet coating or depend spin coating.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The foregoing has described the principles, preferred embodiments and modes of operation of the present invention. However, the invention should be regarded as illustrative rather than restrictive, and not as being limited to the particular embodiments discussed above. The different features of the various embodiments of the invention can be combined in other combinations than those explicitly described. It should therefore be appreciated that those skilled in the art may make variations in those embodiments without departing from the scope of the present invention as defined by the following claims.

The invention claimed is:

1. A nano imprint apparatus comprising: a first imprint module, a second imprint module, an intermediate polymer stamp storage located between the first imprint module and the second imprint module and a feeder module, wherein; the first imprint module is configured to imprint a pattern into an intermediate polymer stamp from a template at a first speed; the feeder module is configured to move the intermediate polymer stamp from the first imprint module to the storage and from the storage to the second imprint module; the second imprint module is configured to imprint a pattern into a substrate from the intermediate polymer stamp at a second speed; and the first speed is different from the second speed.

2. A nano imprint apparatus according to claim 1, wherein the feeder module comprises a robot arm.

3. A nano imprint apparatus according to claim 1, wherein the second imprint module is configured to simultaneously imprint a pattern into a plurality of substrates from a plurality of intermediate polymer stamps.

4. A nano imprint apparatus according to claim 1, wherein the first imprint module is an injection molding module that is configured to imprint the pattern into intermediate polymer stamps by injection molding.

5. A nano imprint apparatus according to claim 1, wherein the first imprint module is a cured film imprint module that is configured to imprint the pattern into the intermediate polymer stamp by pressing the template against the intermediate polymer stamp.

6. A nano imprint apparatus according to claim 1, wherein the second imprint module is a cured film imprint module that is configured to imprint the pattern into the substrate by pressing the intermediate polymer stamp against the substrate.

7. A nano imprint apparatus according to claim 1, wherein the first imprint module comprises a first plurality of first imprinters.

8. A nano imprint apparatus according to claim 7, wherein the second imprint module comprises a second plurality of second imprinters.

9. A nano imprint apparatus according to claim 8, wherein the number of first plurality of first imprinters is less than the second plurality of second imprinters.

10. A nano imprint apparatus according to claim 1, wherein the second imprint module comprises an aligner or positioner, the aligner or positioner comprises means for aligning a central cylindrical protrusion of an intermediate polymer stamp with a central cylindrical hole of a substrate.

11. A nano imprint method comprising the following steps:
arranging a template and an intermediate polymer stamp in a first imprint module;
imprinting a pattern into the intermediate polymer stamp from the template at a first speed;
moving the intermediate polymer stamp from the first imprint module to an intermediate stamp storage located between the first imprint module and a second imprint module;
moving the intermediate polymer stamp from the storage to the second imprint module;
arranging the intermediate polymer stamp to a substrate;
imprinting a pattern into the substrate from the intermediate polymer stamp at a second speed that is different from the first speed.

12. A nano imprint method according to claim 11, wherein the intermediate polymer of the intermediate polymer stamp comprises a polymer foil.

13. A nano imprint method according to claim 11, wherein the pattern is imprinted into a plurality of substrates simultaneously from a plurality of intermediate polymer stamps in the second imprint module.

14. A nano imprint method according to claim 11, wherein, the imprint of the pattern into the intermediate polymer stamp from the template is made by injection molding.

15. A nano imprint method according to claim 11, wherein, the imprint of the pattern into the intermediate polymer stamp from the template is made by pressing the template against the intermediate polymer stamp and thereafter curing the intermediate stamp.

16. A nano imprint method according to claim 11, wherein, the imprint of the pattern into the substrate from the intermediate polymer stamp is made by pressing the intermediate polymer stamp against the substrate and thereafter curing the substrate.

17. A nano imprint method according to claim 11, further comprising the step of aligning or positioning and joining substrates and intermediate polymer stamps for forming combined units.

18. A nano imprint method according to claim 11, further comprising the step of demolding, for removing the imprinted substrate from the intermediate polymer stamp.

19. A nano imprint method according to claim 11, further comprising the step of aligning a central cylindrical protrusion of a intermediate polymer stamp with a central cylindrical hole of a substrate, the intermediate polymer stamp and the substrate forming a combined unit.

* * * * *